United States Patent
Daubenspeck et al.

(10) Patent No.: US 8,994,173 B2
(45) Date of Patent: Mar. 31, 2015

(54) SOLDER BUMP CONNECTION AND METHOD OF MAKING

(71) Applicant: International Business Machines Corporation, Armonk, NY (US)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/927,759

(22) Filed: Jun. 26, 2013

(65) Prior Publication Data
US 2015/0001712 A1    Jan. 1, 2015

(51) Int. Cl.
*H01L 21/4763* (2006.01)
*H01L 23/00* (2006.01)

(52) U.S. Cl.
CPC .............. *H01L 24/11* (2013.01); *H01L 24/13* (2013.01)
USPC ............ 257/737; 257/E21.508; 257/E23.021; 257/738; 438/613; 438/614

(58) Field of Classification Search
CPC .................. H01L 2924/014; H01L 2224/131; H01L 2924/01029; H01L 2224/13099; H01L 2924/01074; H01L 2224/13006; H05K 2201/09436; H05K 3/3452
USPC .......................... 257/E21.508, E23.021, 737; 438/613–614
See application file for complete search history.

(56) References Cited

U.S. PATENT DOCUMENTS

| | | | |
|---|---|---|---|
| 5,493,152 A | 2/1996 | Chang | |
| 6,853,076 B2 * | 2/2005 | Datta et al. | 257/738 |
| 7,329,951 B2 | 2/2008 | Daubenspeck et al. | |
| 7,439,170 B1 | 10/2008 | Daubenspeck et al. | |
| 7,601,628 B2 | 10/2009 | Daubenspeck et al. | |
| 7,615,866 B2 | 11/2009 | Wang et al. | |
| 7,825,511 B2 | 11/2010 | Daubenspeck et al. | |
| 7,863,183 B2 | 1/2011 | Daubenspeck et al. | |
| 8,138,099 B1 | 3/2012 | Daubenspeck et al. | |
| 8,237,279 B2 | 8/2012 | Daubenspeck et al. | |
| RE43,674 E | 9/2012 | Lin et al. | |
| 8,298,930 B2 | 10/2012 | Arvin et al. | |
| 8,338,286 B2 | 12/2012 | Perfecto et al. | |
| 2007/0111502 A1 * | 5/2007 | Daubenspeck et al. | 438/613 |
| 2009/0127710 A1 * | 5/2009 | Daubenspeck et al. | 257/737 |
| 2010/0164096 A1 * | 7/2010 | Daubenspeck et al. | 257/737 |

(Continued)

FOREIGN PATENT DOCUMENTS

| | | |
|---|---|---|
| EP | 0341001 B1 | 11/1989 |
| EP | 0401147 A2 | 5/1990 |
| EP | 0401147 B1 | 5/1990 |

*Primary Examiner* — David Vu
*Assistant Examiner* — Jonathan Han
(74) *Attorney, Agent, or Firm* — David A. Cain; Hoffman Warnick LLC

(57) ABSTRACT

A layer of material can protect a surface of a passivation layer against damage during a final via plug process. The protective layer can be a conductive bump limiting metallurgy (BLM) base layer and can include titanium tungsten (TiW), though other materials can be employed. Examples include applying the protective layer after formation of a via opening and prior to formation of a via opening, and can include applying more protective material after conductor plug formation to enhance protection. Photosensitive and non-photosensitive passivation layers can be so protected.

10 Claims, 15 Drawing Sheets

(56) References Cited

U.S. PATENT DOCUMENTS

2011/0316034 A1* 12/2011 Doan et al. .................. 257/99
2012/0146212 A1* 6/2012 Daubenspeck et al. ....... 257/737
2012/0252205 A1 10/2012 Hotta et al.

* cited by examiner

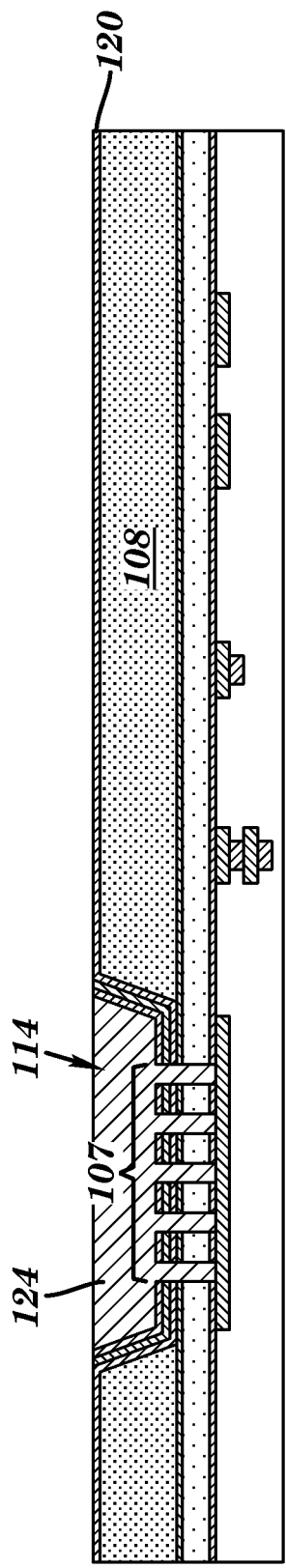
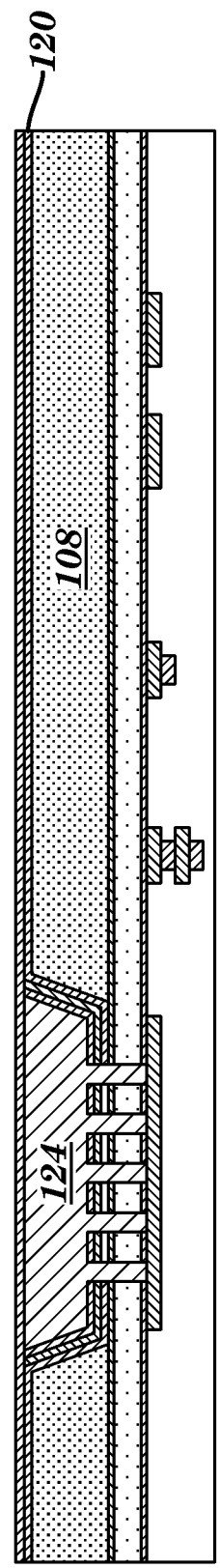

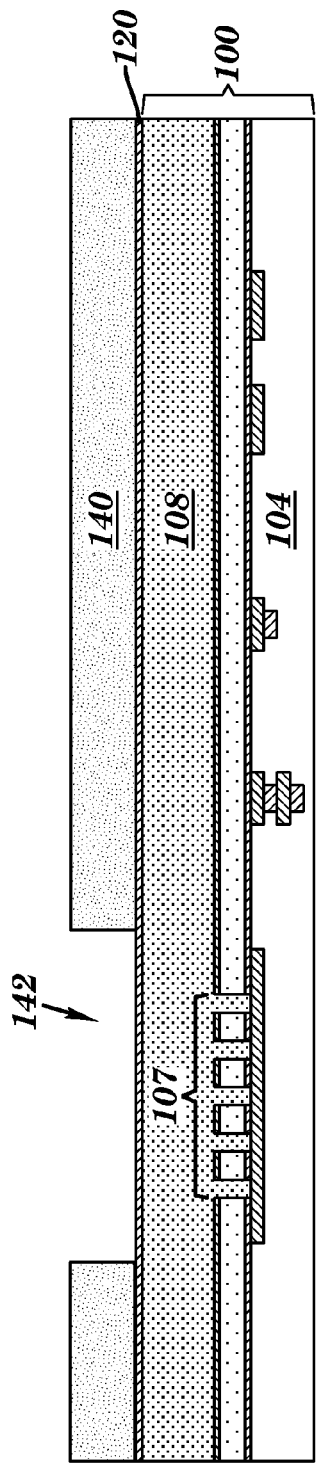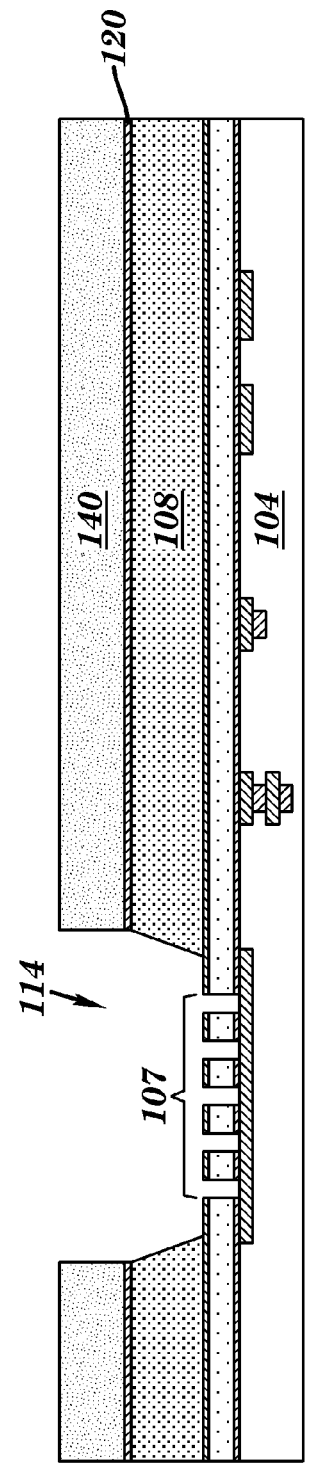

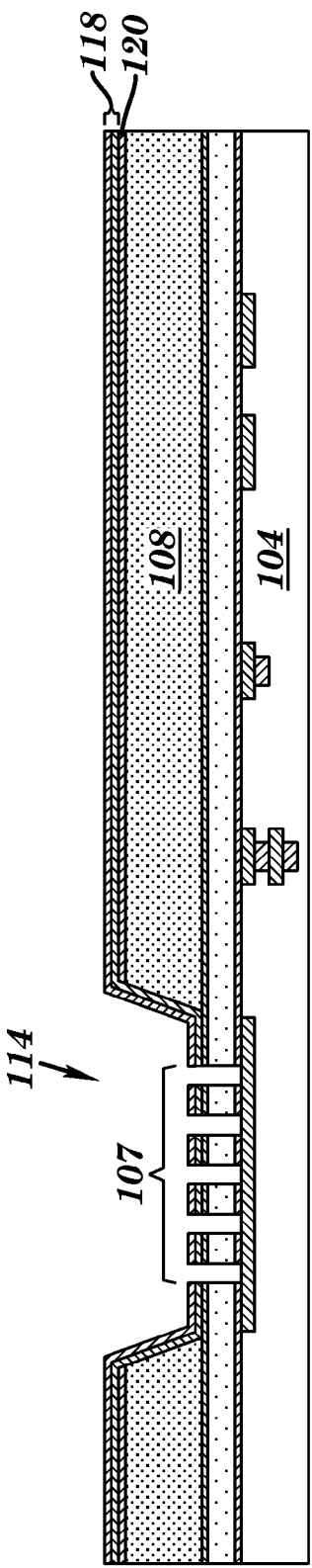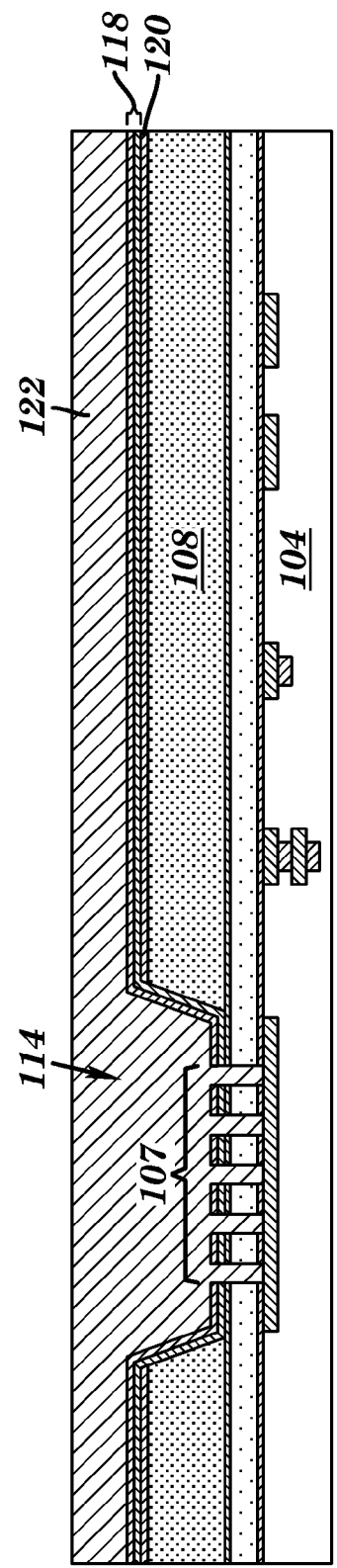

SOLDER BUMP CONNECTION AND METHOD OF MAKING

BACKGROUND

The invention relates generally to semiconductor structures and fabrication of semiconductor chips and, in particular, to solder bump connections and methods for fabricating solder bump connections during back-end-of-line (BEOL) processing of semiconductor chips.

A chip or die includes integrated circuits formed by front-end-of-line (FEOL) processing and metallization levels of an interconnect structure formed by back-end-of line (BEOL) processing. Chips are then packaged and mounted on a circuit board. Solder bumps are commonly utilized to provide mechanical and electrical connections between the last or top metallization level and the circuit board. A common type of solder bump is the controlled collapse chip connection (C4) solder bump. Controlled collapse chip connection (C4) processes are well known in forming solder bumps in semiconductor fabrication. During assembly of the chip and circuit board, C4 solder bumps establish physical attachment and electrical contact between an array of C4 pads on the chip and a complementary array of C4 pads on the circuit board.

Conventional solder bump connections employ a technique called ball limiting metallurgy (BLM) in which layers of a particular group of metals can promote the attachment of the C4 solder bump to the chip. These "BLM layers" can promote adhesion between an underlying dielectric passivation layer and a metal pad, promote solder wetting, and act as a solder diffusion barrier. A variant of the C4 process, such as disclosed, for example, in U.S. Pat. No. 7,825,511 and/or U.S. Patent Application Publication No. 2012/0146212, the disclosures of which are incorporated by reference, eliminates the use of an aluminum (Al) pad structure as a cost-saving measure in chip fabrication. Instead, the aluminum (Al) pad structure is replaced with a process and structure that makes use of a thick layer of Cu to completely fill the final polyimide via opening to comprise the chip side interface structure for the C4 chip-to-package interconnect. This "plug via" formation process can employ a relatively thick Cu layer deposited directly on a cured, final level polyimide (PI) layer, which can then be planarized using chemical mechanical polishing (CMP) to leave a plug of copper within the final PI structure. The final via plug can be used in conventional under bump metallurgy (UBM) and/or C4 processes and can make an electrical connection between a resulting solder bump and the final copper metallization level in the BEOL without an aluminum pad. The plug via process offers significant advantages over other techniques, including allowing fabrication of structures on a smaller level than previously achieved, but efforts continue to improve plug via processes and semiconductor device manufacture as a whole.

SUMMARY

An embodiment of the invention disclosed herein can take the form of a method of fabricating a solder bump connection in which an initial layer stack can be formed. The initial layer stack can include a first dielectric layer over an underlying dielectric layer, the underlying dielectric layer including a metal line. A passivation layer can be formed over the initial layer stack, and a protective layer can be formed on at least a portion of a surface of the passivation layer. A via opening can be formed in the passivation layer and the first dielectric layer of the initial stack, and a conductive plug can be formed in the via opening. A solder bump in electrical communication with the conductive plug can be formed, and at least a portion of the protective layer can be removed to expose the top surface of the passivation layer.

Another embodiment of the invention disclosed herein can take the form of a solder bump connection including a layer stack with a first dielectric layer on an underlying dielectric layer, the underlying dielectric layer including a metal line. At least a portion of the metal line can contact a bottom surface of the first dielectric layer, and a passivation layer can be on at least a portion of a top surface of the layer stack. A ball limiting metallurgy (BLM) base layer of a first conductor can cover at least a portion of a top surface of the passivation layer, and a via opening can extend through the passivation layer over the at least a portion of the metal line. The via opening can include a connection to a top surface of the at least a portion of the metal line, and a conductive plug of a second conductor can substantially fill the via opening. A seed layer of a third conductor can coat at least the via opening under the conductive plug, and a solder ball can lie above the conductive plug.

A further embodiment of the invention disclosed herein can take the form of an integrated circuit (IC) package structure with at least one solder bump connection. Each solder bump connection can include an initial layer stack and a passivation layer on a top surface of the layer stack. The initial stack can include a first dielectric layer on an underlying dielectric layer, the underlying dielectric layer including a metal line, at least a portion of the metal line contacting a bottom surface of the first dielectric layer. A via opening through the passivation layer over at least a portion of the metal line can expose the top surface of the layer stack in a bottom of the via opening. Each connection can additionally include a protective layer of a ball limiting metallurgy (BLM) material on at least a portion of a top surface of the passivation layer, as well as a conductive plug of a first conductor in the via opening. A solder ball can be in electrical communication with the conductive plug, and a portion of the top surface of the passivation layer around the top surface of the conductive plug can be exposed.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

FIGS. 3-10 are schematic cross sectional illustrations of stages of fabrication of a solder bump connection according to an embodiment of the invention disclosed herein.

FIGS. 22-28 are schematic cross-sectional illustrations of stages of fabrication of a solder bump connection according to an embodiment of the invention disclosed herein including the initial layer stack of FIG. 2.

DETAILED DESCRIPTION

Figure 1:
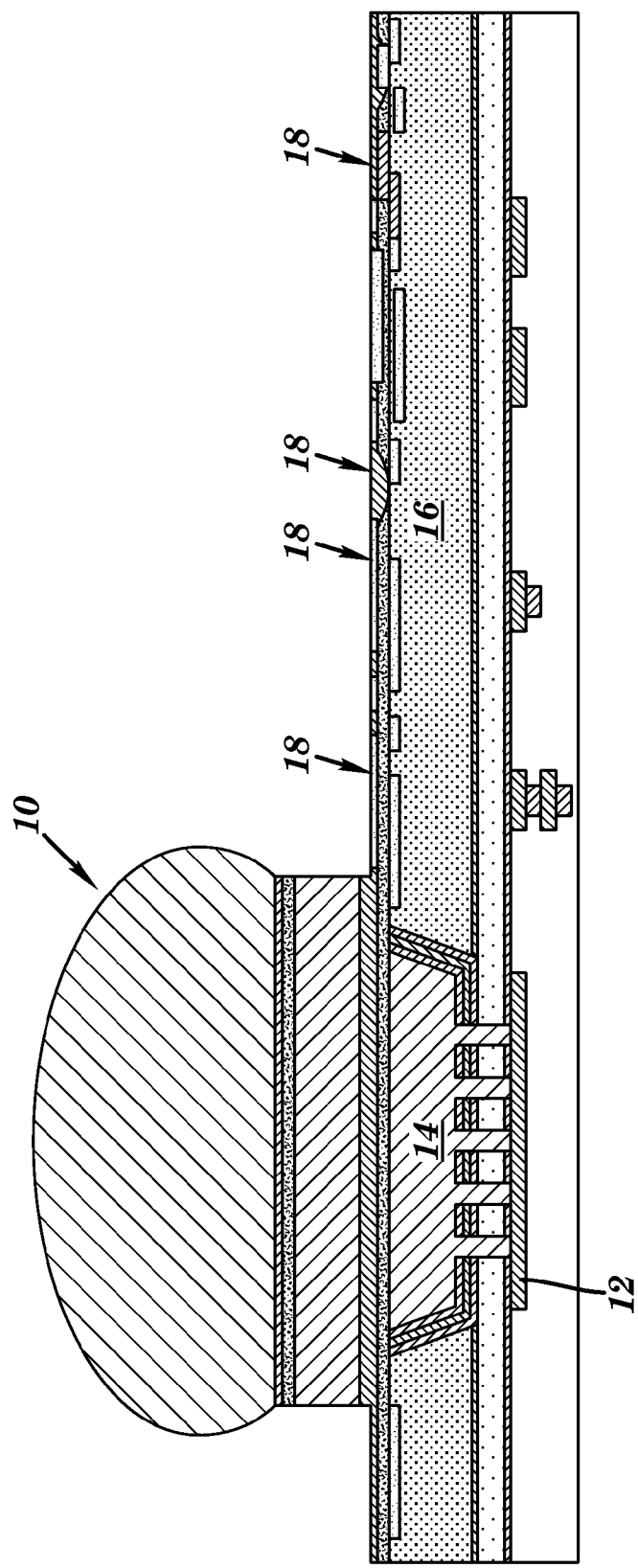
FIG. 1 is a schematic cross sectional illustration of a prior art solder bump connection.

In conventional solder bump fabrication processes, particularly those employing C4 and/or standard plug final via processes, a top surface of a passivation layer is typically left exposed after formation of a solder bump, and so is a contact surface during packaging of a semiconductor device in which the passivation layer is included. For example, in FIG. 1, a prior art plug via process can produce a solder bump 10 connected to a metal line 12 via a copper-filled via 14. The via 14 is formed in a final passivation layer 16, a top surface of passivation layer 16 being exposed after formation of solder bump 10. The materials typically used to form a passivation layer, such as a polyimide (PI), tend to be relatively soft, in some cases even gelatinous, and hence more susceptible to damage than dielectric and/or conductor layers. Thus, as illustrated, the top surface of passivation layer 16 can be damaged during processing and/or fabrication, such as by a pad used in chemical mechanical polishing (CMP) to remove excess copper (Cu) after filling via 14 and/or to remove material of other layers. For example, a pad used in the CMP process can scratch or abrade the surface of the passivation layer, embed copper or other materials in the passivation layer, introduce discontinuities at the edge of the via, create cavities in the surface, and/or otherwise create defects 18 in areas of passivation layer 16 where most or all of the copper has been removed.

Such passivation layer damage can reduce reliability of a semiconductor device packaging interface, and so processes have been employed to recondition the surface of the passivation layer, such as wet cleans and plasma treatments, which can be expensive and time consuming. The resulting reconditioned surface of the passivation layer, while far better than a surface without reconditioning, is still not as desirable as the initial, undamaged passivation layer surface prior to CMP. Thus, embodiments of the invention disclosed herein provide an improved solder bump fabrication process, particularly useful in final passivation plug via processes, in which the passivation layer surface can be protected against damage. In particular, embodiments form a protective layer on the top surface of the passivation layer, such as with a conductive layer used in BMP. For example, a BLM base layer and/or a copper seed layer can be used, as will be explained below.

Figure 2:
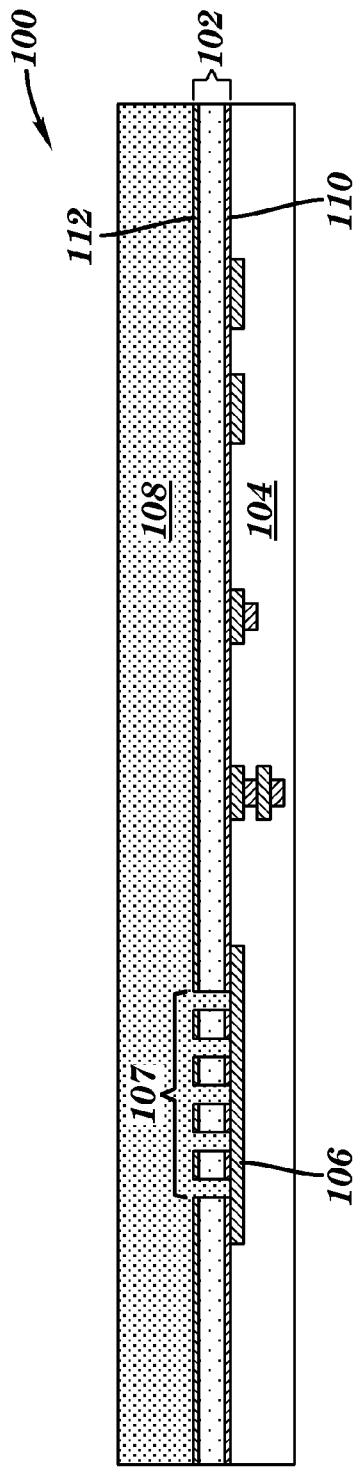
FIG. 2 is a schematic illustration of an initial layer stack that can be used according to an embodiment of the invention disclosed herein.

FIG. 2 shows an initial layer stack 100 formed in known ways, such as according to part of the solder bump fabrication processes discussed above, that can be employed in embodiments of the invention disclosed herein. The initial layer stack 100 can include a first dielectric layer 102 on an underlying dielectric layer 104, with a metal line 106 in underlying dielectric layer 104. At least a portion of metal line 106 can be in contact with a bottom surface of first dielectric layer 102, and connector openings 107 can allow access through first dielectric layer 102 to a top surface of metal line 106. A passivation layer 108 can be applied to a top surface of first dielectric layer 102, filling connector openings 107, and can be used in the fabrication of embodiments as will be described. It should be understood that first dielectric layer 102 in embodiments can encompass additional layers, such as a copper capping layer 110 between the first and underlying dielectric layers 102, 104, and/or nitride layer 112 between first dielectric layer 102 and passivation layer 108. With this understood, reference will simply be made to first dielectric layer 102 for descriptive purposes below. Initial layer stack 100 can also include diffusion barrier layers, seed layers, BLM base layers, and the like, which in some cases may not be shown, but fall within the scope of embodiments of the invention disclosed herein. Initial layer stack 100 can be used as a starting point for descriptive purposes of embodiments of the invention disclosed herein.

Figure 3:
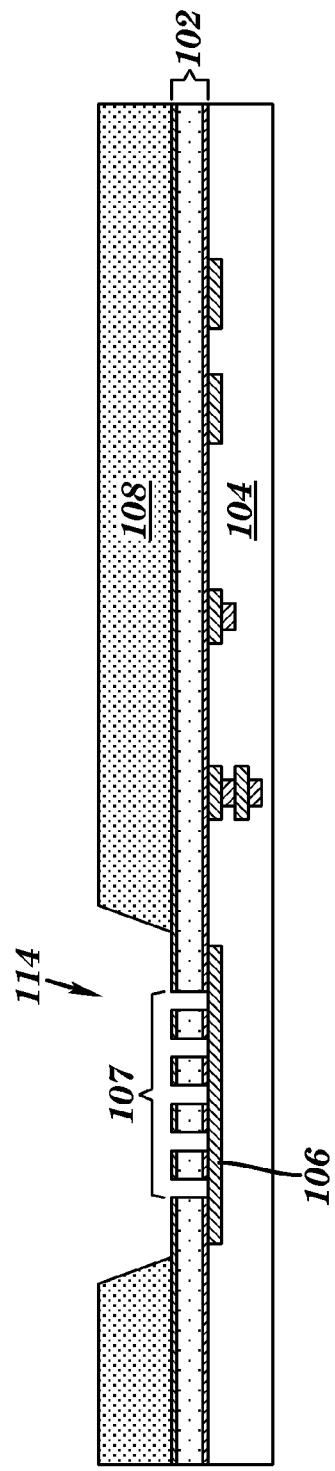
Figure 4:
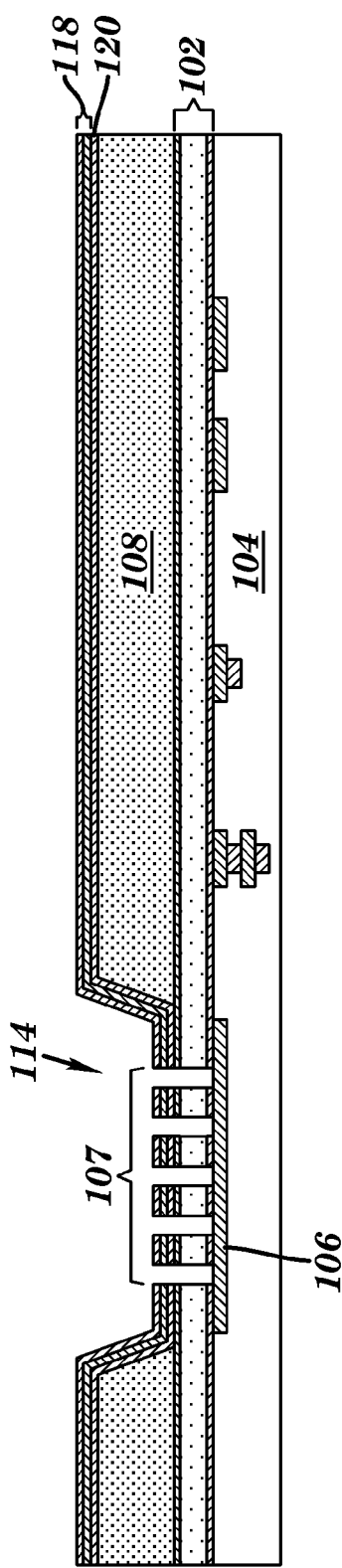

As seen in FIG. 3, a via opening 114 can be formed in passivation layer 108 to extend to a top surface of first dielectric layer 102, and material can be removed from connector openings 107 from the bottom of via opening 114 and through first dielectric layer 102 to provide access to metal line 106. Continuing to FIG. 4, ordinarily, a seed layer 118 would be applied to passivation layer 108, but embodiments add a protective layer 120, such as a BLM base layer, between passivation layer 108 and seed layer 118 that is significantly more resistant to damage and to CMP than passivation layer 108. Thus, protective layer 120 can be applied to all exposed surfaces, and a seed layer 118 can be applied over protective layer 120 to aid in subsequent deposition of a first conductor layer 122, such as copper (Cu), seen in FIG. 5. It should be understood that protective layer 120 and seed layer 118 in embodiments coat surfaces of passivation layer 108, via opening 114, and/or connector openings 107, as well as any other surfaces exposed during deposition of the base and/or seed layers 120, 118. As a result, these layers are likely to remain in conductive pathways and should therefore be conductive layers. Seed layer 118 can include, for example, tantalum (Ta), tantalum nitride (TaN), copper (Cu), and/or any mixture thereof, though other materials can be employed so long as the resultant layer has electrical and/or chemical properties that enhance nucleation and/or formation of copper thereon. Likewise, protective layer 120, particularly when implemented as a BLM base layer, can include titanium tungsten (TiW) or another conductive material with similar chemical and/or electrical properties, but other materials can be used, including, but not limited to, Ta, TaN, Ti, TiN, W or any similar material. Note that it can be advantageous from the standpoint of process integration for the protective layer 120 to be formed from the same material as the BLM base layer. This can enhance efficiency of a set of processes and film thicknesses since redeposition of additional BLM base layer material later during the initial formation of the BLM structure can be avoided. In addition, protective layer 120 can be construed as a first conductive layer, so that first conductor layer 122 can be construed as a second conductive layer. It should be understood that many layers, such as seed layer 118, can include multiple layers of material themselves in embodiments as may be suitable and/or appropriate.

Figure 5:
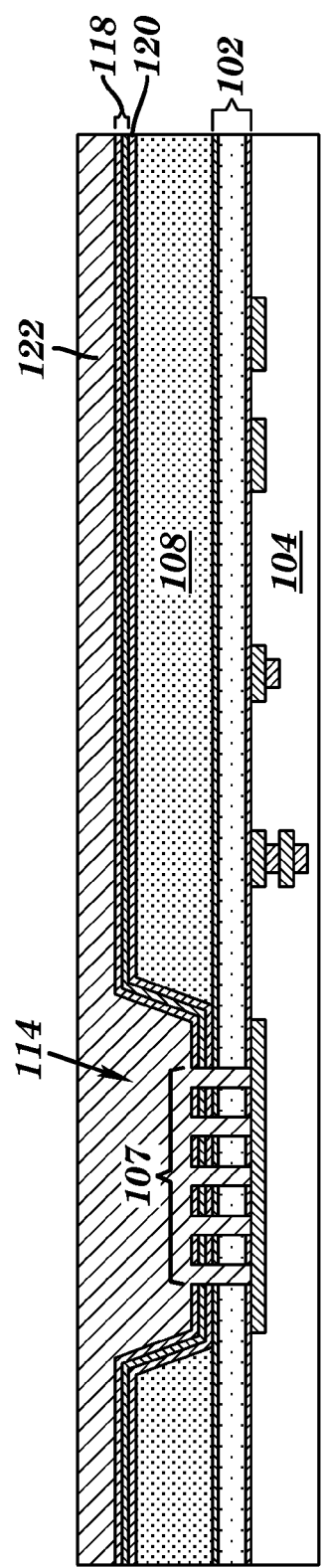

With base and seed layers 120, 118 formed, first conductor layer 122 can be applied, which, in embodiments as seen in FIG. 5, can be a relatively thick layer of copper (Cu) that can at least fill via opening 114 and can rise significantly beyond that level if so desired and/or appropriate. A removal process, such as CMP, can be used to remove material of first conductor layer 122 and/or seed layer 118 so that, as seen in FIG. 6, a portion of first conductor layer 122 and/or seed layer 118 extending no deeper than a plane including at least a portion of protective layer 120 and above passivation layer 108 is removed. This leaves a plug 124 of material from first conductor layer 122, such as a copper plug where copper is used in first conductor layer 122. Because protective layer 120 is deposited on top of passivation layer 108, and because protective layer 120 is more resistant to damage than passivation layer 108, CMP can be stopped at protective layer 120, avoiding damage to passivation layer 108.

With copper plug 124 formed and exposed, protective layer 120 can be supplemented, if necessary and/or desired, by application of additional base layer material, such as TiW, which can coat an exposed surface of copper plug 124 as seen in FIG. 7. Supplementing protective layer 120 can be advantageous in that some of protective layer 120 may be removed during CMP, so that a remaining thickness of material could be insufficient to protect passivation layer 108 in another round of removal, such as an additional CMP process. Thus, increasing thickness of protective layer 120 can ensure that passivation layer 108 remains protected during subsequent rounds of material removal, particularly by CMP. The added material that covers plug 124 in embodiments is conductive and can be beneficial in solder bump fabrication by including a BLM base layer as described above. Protective layer 120 when supplemented can in embodiments be construed as including multiple sublayers of material, here, for example, two layers of a same BLM base material.

Figure 8:
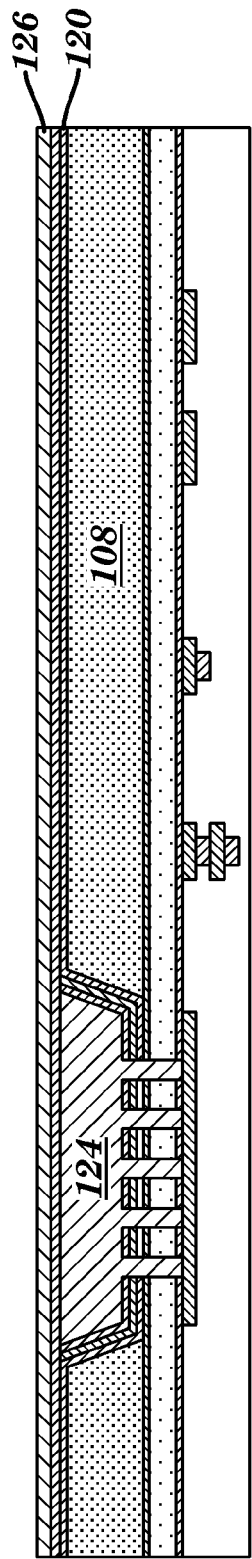
Figure 9:
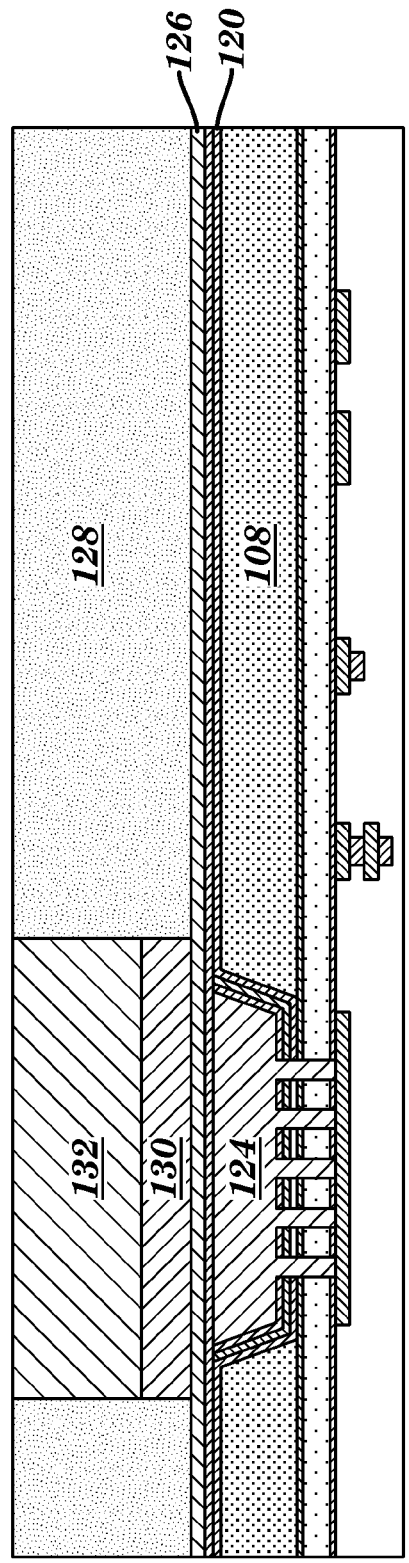
Figure 10:
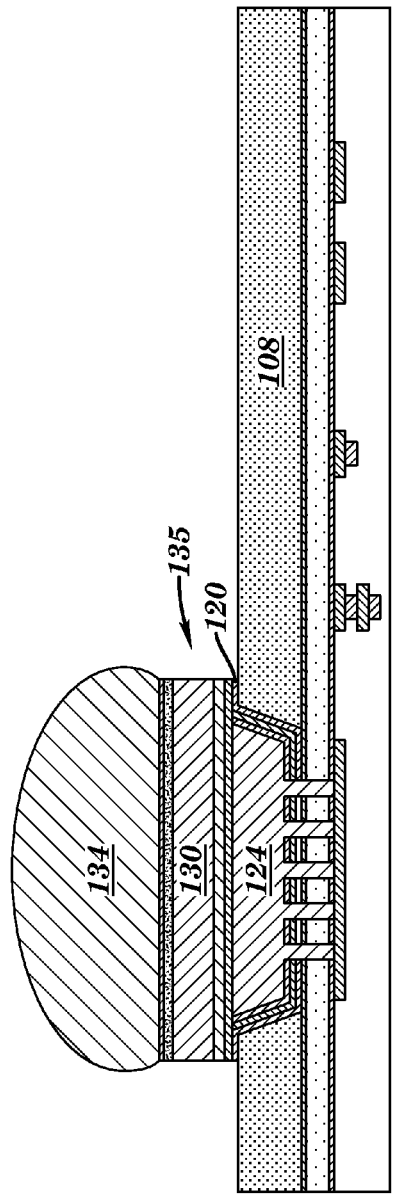

Continuing to FIG. 8, a second conductor layer 126, which can be construed as a third conductive layer, can be applied to supplemented protective layer 120, and, as shown in FIG. 9, a photosensitive layer 128 can be applied so a conductive pad 130 and a solder plug 132 can be formed according to known C4 processes. Photosensitive layer 128 can include a photoactive polymer material that responds to a particular range of wavelengths of electromagnetic radiation so that photosensitive layer 128 can be patterned and developed to form a cavity that can act as a mask. An example of a suitable photoactive polymer material is RISTON, manufactured by DuPont. As seen in FIG. 10, a solder ball 134 can be formed, and material around pad 130 can be removed down to protective layer 120. Because material used to form protective layer 120 has different properties than first and second conductor layers 122, 126, any seed layers, and photosensitive layer 128, a different process can then be used to remove all but a portion of protective layer 120 from passivation layer 108. Thus, at least a portion of passivation layer 108 can be left exposed and substantially undamaged. As can be seen in FIG. 10, this can leave plug 124 surrounded by material of protective layer 120, as well as a collar 135 of material that can include portions of second conductor layer 126 (FIG. 9).

Figure 11:
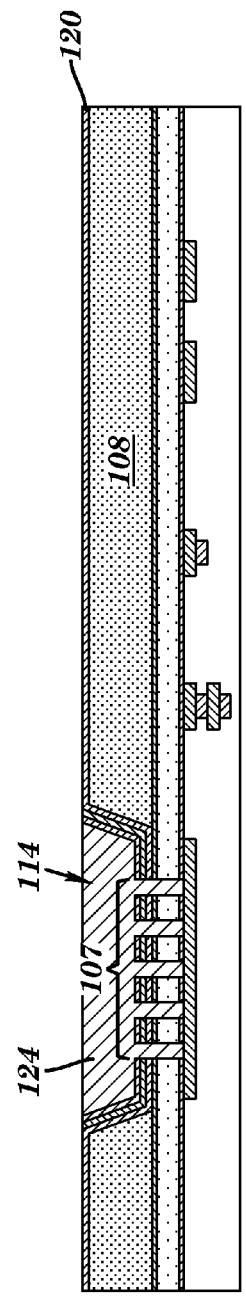
FIGS. 11-14 are schematic cross-sectional illustrations of fabrication of a solder bump connection according to an embodiment of the invention disclosed herein starting with the stage shown in FIG. 6.
Figure 12:
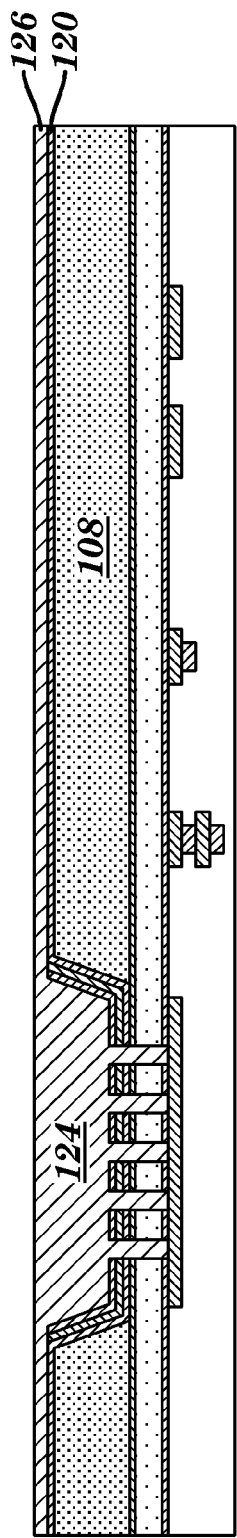
Figure 13:
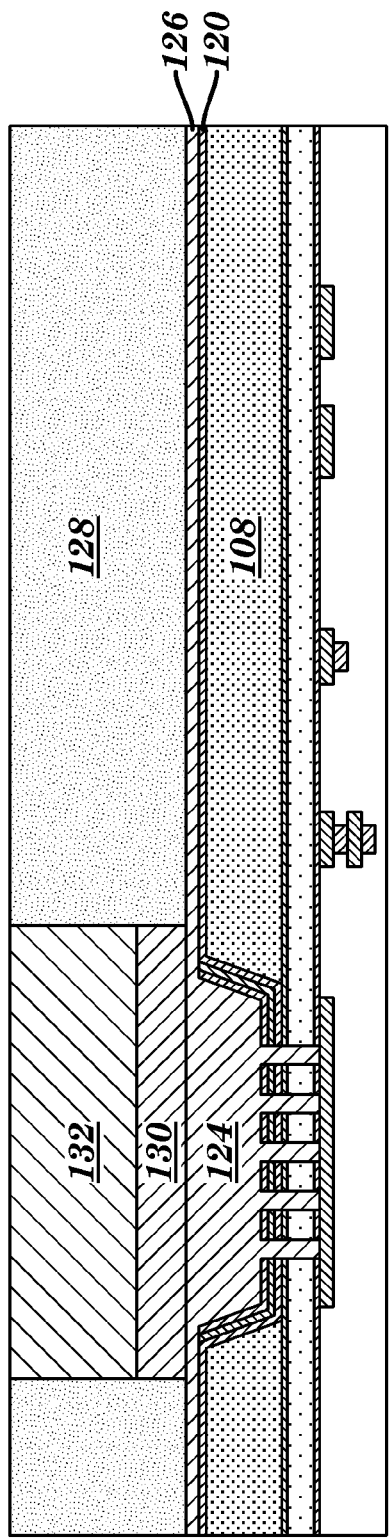
Figure 14:
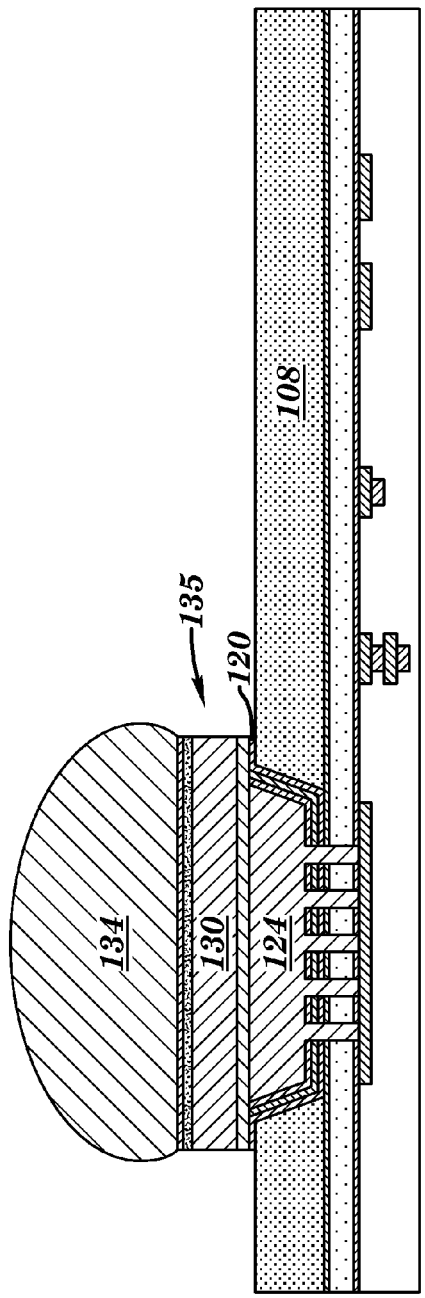

If desired, the supplementing of protective layer 120 shown in FIG. 7 can be omitted. Thus, starting with plug 124 having just been formed as shown in FIG. 11, second conductor layer 126 can be applied in direct contact with plug 124 as shown in FIG. 12, though a seed layer may be included therebetween in embodiments. Additional known C4 processes can be applied, referring now to FIG. 13, to form pad 130 and solder plug 132 in photosensitive layer 128. Further known C4 processes can be employed to form solder bump 134 shown in FIG. 14, as well as to remove material around pad 130 down to protective layer 120. Because material used to form protective layer 120 has different properties than first and second conductor layers 122, 126, any seed layers, and photosensitive layer 128, a different process, such as reactive ion etching (RIE), can then be used to remove protective layer 120 around via opening 114 from passivation layer 108. Thus, at least a portion of passivation layer 108 can be left exposed and substantially undamaged. In addition, this can leave plug 124 seated in via opening 114 on portions of seed and base layers 118, 120, and can include a collar 135 around via opening 114 that can aid in solder bump control during semiconductor device packaging. Embodiments can be employed in semiconductor device packaging, such as in an integrated circuit (IC) packaging structure including at least one solder bump connection formed in accordance with the teachings herein.

Figure 15:
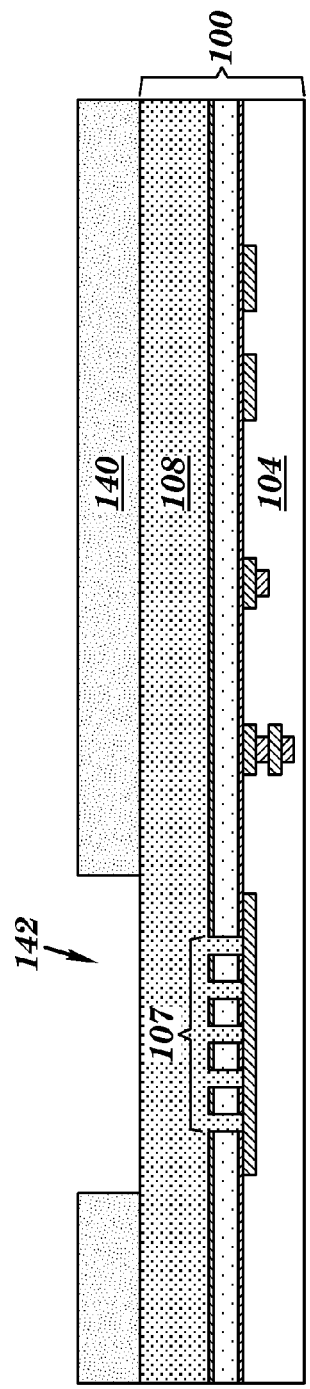
FIGS. 15-21 are schematic cross sectional illustrations of stages of fabrication of a solder bump connection according to an embodiment of the invention disclosed herein including the initial layer stack of FIG. 2.
Figure 16:
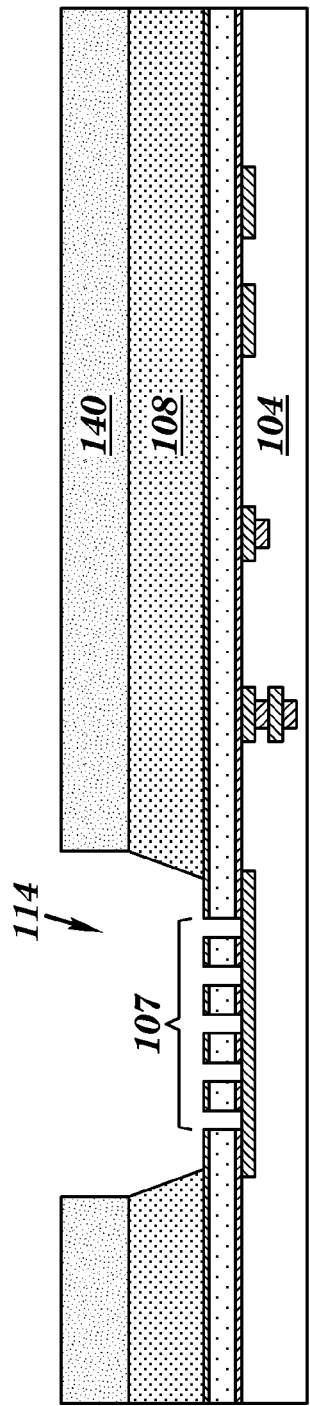
Figure 17:
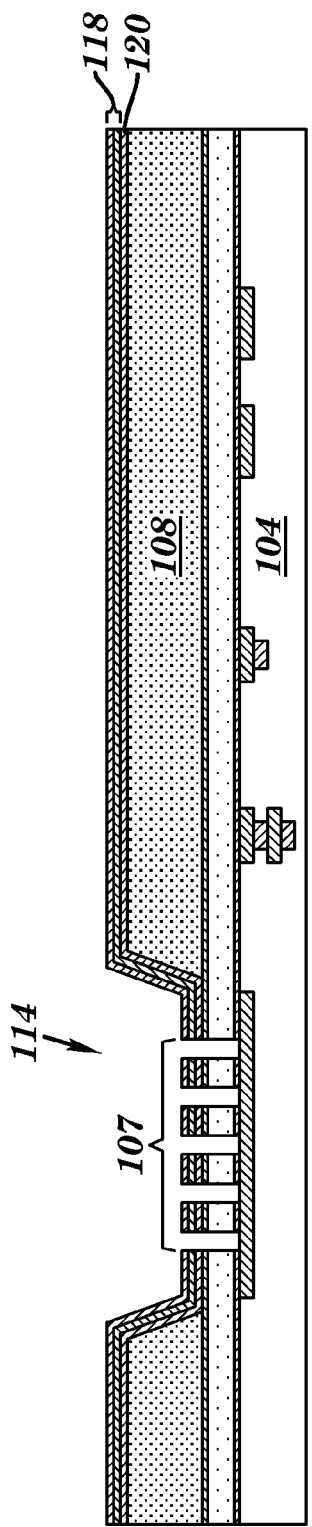
Figure 18:
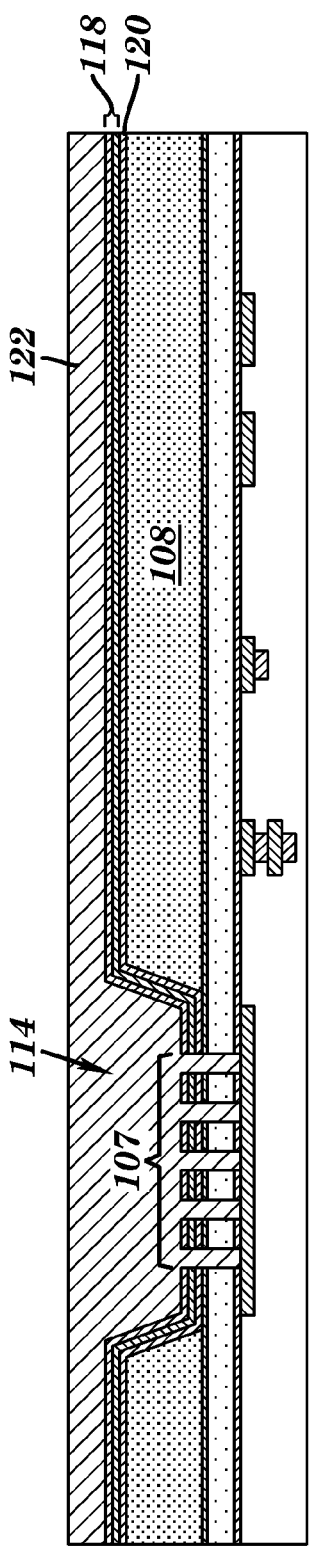
Figure 19:
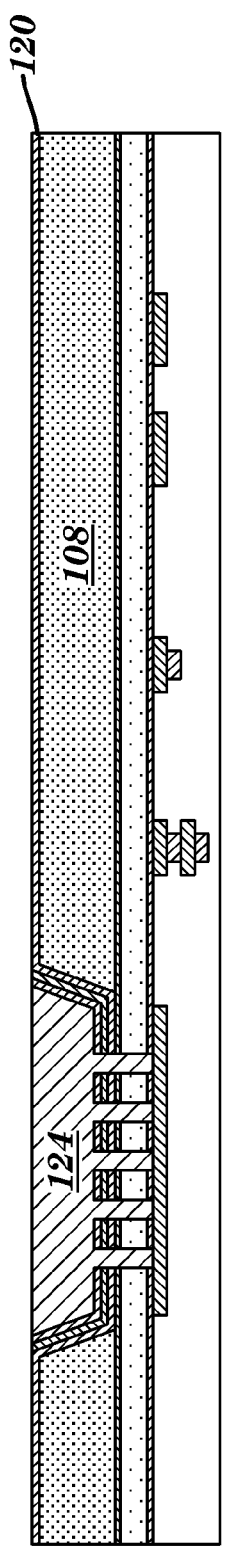
Figure 20:
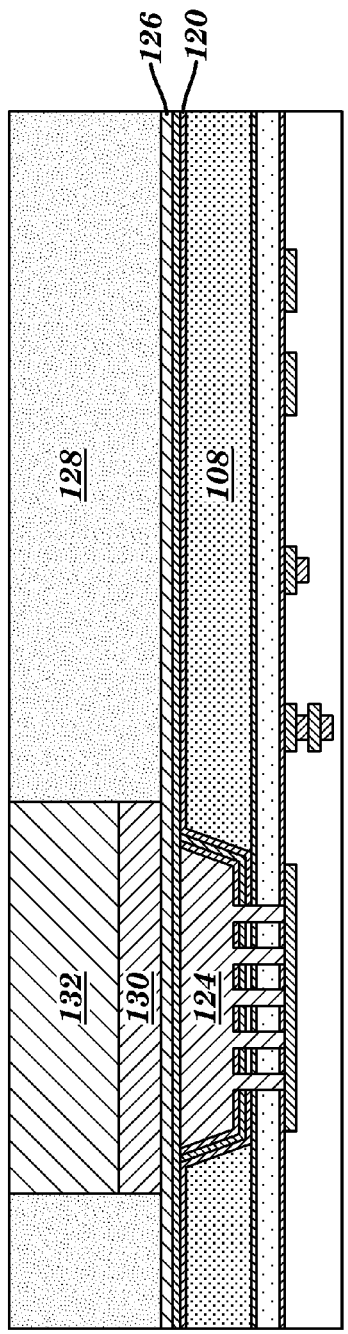
Figure 21:
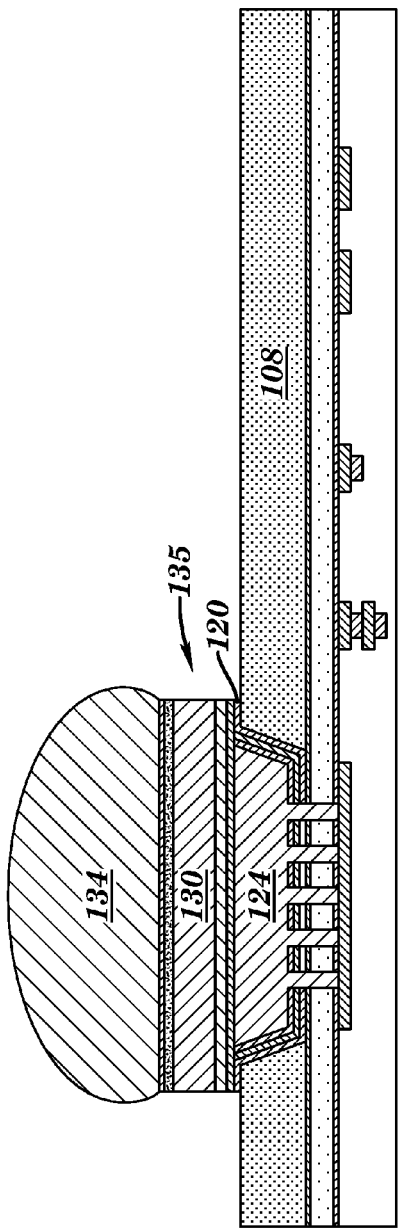

The examples described above are particularly useful when a photosensitive passivation layer, such as photosensitive polyimide (PSPI), is employed, since PSPI can be patterned directly in forming via opening 114 and other structures. However, embodiments can also be applied to passivation layers that are not photosensitive. For example, as seen in FIG. 15, a photoresist layer 140 can be applied to initial stack 100, patterned, and processed to form a cavity 142 in photoresist layer 140, exposing a portion of passivation layer 108. Material of passivation layer 108 can then be removed from under cavity 142, as shown in FIG. 16, to form via opening 114. Continuing to FIG. 17, photoresist layer 140 can be removed, and protective layer 120, as well as seed layer 118, can be applied to all exposed surfaces. As above, it should be understood that protective layer 120, and seed layer 118, if included, can cover exposed surfaces of connector openings 107 even though such may not be visible in the drawings. First conductor layer 122 can then be applied as seen in FIG. 18, and, continuing to FIG. 19, material can be removed down to protective layer 120 to form conductive or conductor plug 124, which can include material of first conductor layer 122. As above, known C4 processes can be employed to subsequently apply second conductor layer 126 and photosensitive layer 128 as seen in FIG. 20, and to form pad 130 and solder plug 132. As can also be seen in FIG. 20, protective layer 120 can be supplemented so that plug 124 can be covered by material of protective layer 120, though this is not required. Continuing to FIG. 21, additional known C4 processes can be employed to form solder ball 134 and to remove photosensitive layer 128, second conductor layer 126, and any other material around pad 130 down to protective layer 120. Protective layer 120 can then be removed from around pad 130 to expose passivation layer 108 and leave a collar 135 around via opening 114. As can be seen in FIG. 21, conductive or conductor plug 124 can be surrounded by material of protective layer 120 where protective layer 120 is supplemented prior to formation of second conductor layer 126, but will appear more as in FIG. 14 when protective layer 120 is not supplemented.

FIGS. 22-28 show an additional example of an improved plug via process according to embodiments of the invention disclosed herein. As shown in FIG. 22, protective layer 120 can be applied to or formed on passivation layer 108 before formation or application of photoresist layer 140. Cavity 142 can be formed using patterning and removal, and, as shown in FIG. 23, material of protective layer 120 and passivation layer 108 can be removed to form via opening 114 and clear connector openings 107. Photoresist layer 140 can be removed as shown in FIG. 24, and seed layer 118 can be applied. As opposed to other embodiments, because protective layer 120 is formed on passivation layer 108 before via opening 114 is formed, no material of protective layer 120 is present in via opening 114 or in connector openings 107. Thus, seed layer 118, while coating protective layer 120 outside of via opening 114, coats exposed surfaces in via opening 114 and connector openings 107 directly.

Figure 26:
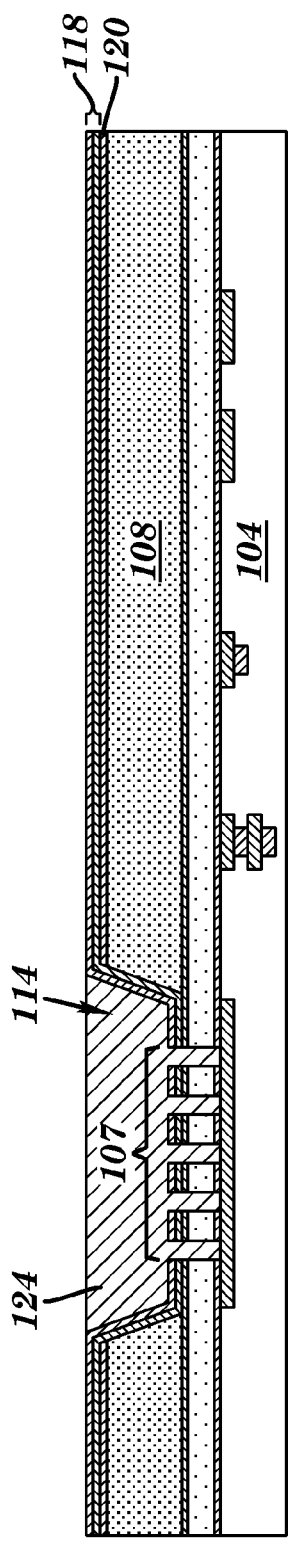
Figure 27:
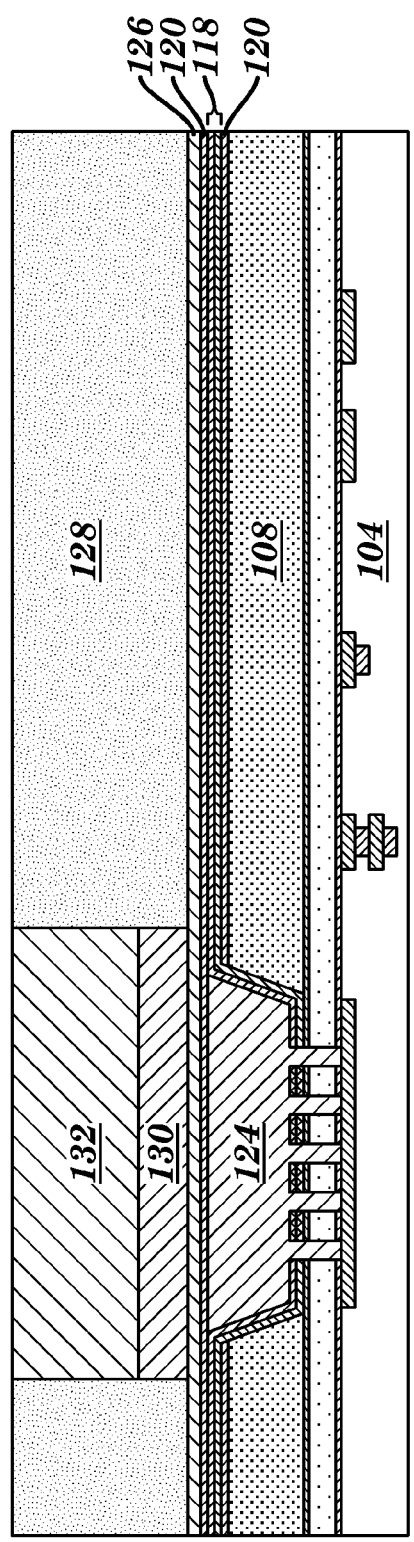

Continuing to FIG. 25, with seed layer 118 formed, first conductor layer 122 can be formed to fill via opening 114 and connector openings 107, as well as to have a thickness over other exposed surfaces. Material of first conductor layer 122 can then be removed, as seen in FIG. 26, down to the level of seed layer 118, forming conductive or conductor plug 124. As a result of removing material only as far as seed layer 118, a portion of plug 124 can project above the level of protective layer 120. With plug 124 formed, second conductor layer 126 can be formed, optionally preceded by forming another seed layer, and known C4 processes can be used, as seen in FIG. 27, to form photoresist layer 128, pad 130, and solder plug 132. In embodiments, protective layer 120 can be supplemented by applying more material of protective layer 120 to cover plug 124 as shown, though this may be omitted as desired and/or appropriate. In embodiments, an additional seed layer 118 may be applied before protective layer 120 is supplemented and/or after protective layer 120 is supplemented. Where protective layer 120 is supplemented, it may in embodiments be construed as including multiple sublayers, such as of a same BLM base material and/or additional materials.

Figure 28:
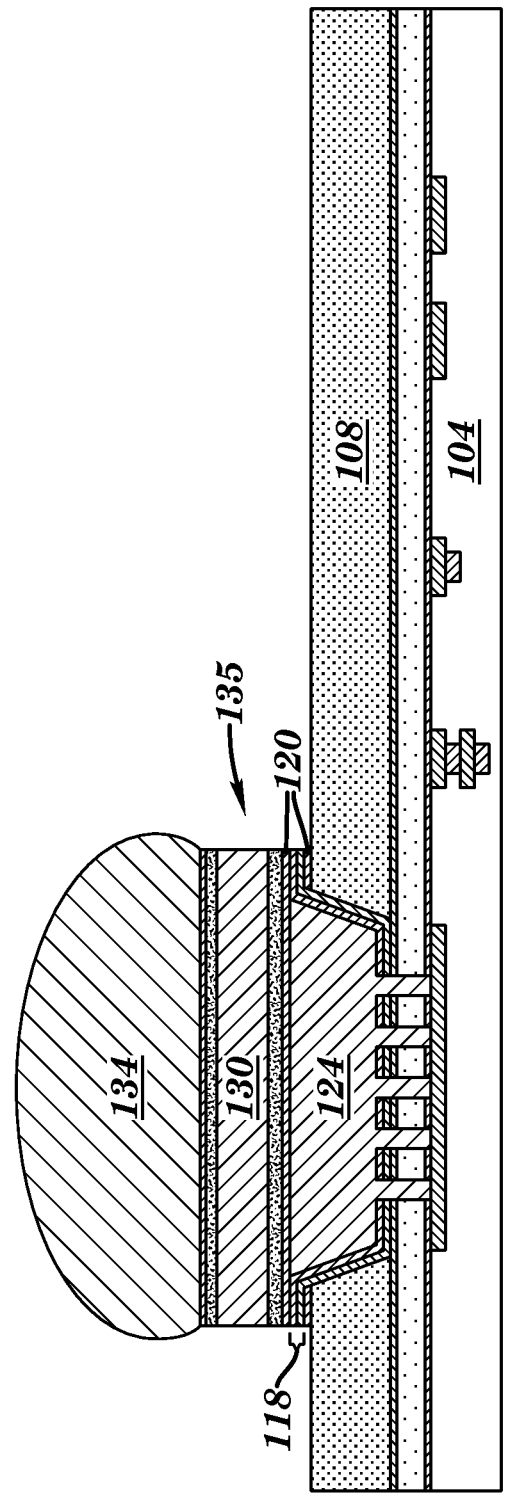

Moving to FIG. 28, additional known C4 processes can be employed to form solder ball 134, and to remove material around via opening 114 down to the level of protective layer 120. Again, since protective layer 120 can have different chemical and/or electrical properties from seed layer 118, second conductor layer 126, and other material layers, a different process can be used to remove material of protective layer 120 around via opening 114 to expose passivation layer 108. As seen in FIG. 28, a collar 135 can also be formed, and material of protective layer 120 only covers plug 124 when protective layer 120 has been supplemented. In implementations in which protective layer 120 has not been supplemented, the portion of base layer over plug 124 would not be present, and base layer material thickness in collar 135 could be reduced.

As described herein, embodiments provide an improved C4 process that protects a passivation layer against damage during processing, such as CMP. Since the passivation layer does not experience damage, or at least experiences significantly less damage, reliability of packaging of semiconductor devices can be improved. Embodiments can be employed in semiconductor device packaging, such as in an integrated circuit (IC) packaging structure including at least one solder bump connection formed in accordance with the teachings herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A solder bump connection comprising:
  a layer stack including a first dielectric layer on an underlying dielectric layer, the underlying dielectric layer including a metal line, at least a portion of the metal line contacting a bottom surface of the first dielectric layer;
  a passivation layer on at least a portion of a top surface of the layer stack;
  a ball limiting metallurgy (BLM) base layer of a first conductor on at least a portion of a top surface of the passivation layer;
  a via opening through the passivation layer over the at least a portion of the metal line and including a connection to a top surface of the at least a portion of the metal line;
  a conductive plug of a second conductor substantially filling the via;
  a seed layer of a third conductor in at least the via opening under the conductive plug;
  a solder ball above the conductive plug; and
  a supplemental layer of the first conductor over both a portion of the base layer on the passivation layer and on a top surface of the conductive plug.

2. The solder bump connection of claim 1, wherein the base layer conforms to a surface of the via opening under the conductive plug, and the seed layer conforms to a top surface of the base layer in the via opening under the conductive plug.

3. The solder bump connection of claim 1, wherein the first conductor includes at least one of a titanium tungsten (TiW) alloy, tantalum (Ta), tantalum nitride (TaN), or a tungsten nitride ($WN_x$).

4. The solder bump connection of claim 1, wherein the second conductor includes copper (Cu) and the third conductor includes at least one of copper (Cu), chromium (Cr), tantalum (Ta), or tantalum nitride (TaN).

5. The solder bump connection of claim 1, wherein the passivation layer includes polyimide.

6. An integrated circuit (IC) package structure comprising:
  at least one solder bump connection each including:
    an initial layer stack including a first dielectric layer on an underlying dielectric layer, the underlying dielectric layer including a metal line, at least a portion of the metal line contacting a bottom surface of the first dielectric layer;
    a passivation layer on a top surface of the layer stack;
    a via opening through the passivation layer over at least a portion of the metal line and exposing the top surface of the layer stack in a bottom of the via opening;
    a protective layer of a ball limiting metallurgy (BLM) material on at least a portion of a top surface of the passivation layer;
    a conductive plug of a first conductor in the via;
    a solder ball in electrical communication with the conductive plug; and
    an exposed portion the top surface of the passivation layer around the top surface of the conductive plug; and
    a supplemental layer of the protective layer over both a portion of the protective layer on the passivation layer and on a top surface of the conductive plug.

7. The IC package structure of claim 6, wherein at least a portion of the protective layer covers the conductive plug.

8. The IC package structure of claim 6, wherein the protective layer conforms to a surface of at least one of the passivation layer or the initial stack in the via opening such that at least a portion of the protective layer lies between a bottom of the conductive plug and the at least one of a surface of the passivation layer or the initial stack in the via opening.

9. The IC package structure of claim 6, wherein substantially none of the protective layer lies between a bottom of the conductive plug and a surface of at least one of the passivation layer or the initial stack in the via opening.

10. The IC package structure of claim 6, wherein the removing of the first conductor includes chemical-mechanical polishing (CMP) of the second conductor.

* * * * *